United States Patent [19]
Nakamura

[11] Patent Number: 5,986,333
[45] Date of Patent: Nov. 16, 1999

[54] SEMICONDUCTOR APPARATUS AND METHOD FOR FABRICATING THE SAME

[75] Inventor: Akio Nakamura, Tokyo, Japan

[73] Assignee: Oki Electric Industry Co., Ltd., Tokyo, Japan

[21] Appl. No.: 08/916,445

[22] Filed: Aug. 22, 1997

[30] Foreign Application Priority Data

Feb. 27, 1997 [JP] Japan .................................. 9-043156

[51] Int. Cl.⁶ .............................................. H01L 23/495
[52] U.S. Cl. ......................... 257/667; 257/670; 257/666
[58] Field of Search .................................. 257/667, 670, 257/666; 438/123; 361/813

[56] References Cited

U.S. PATENT DOCUMENTS

| | | | |
|---|---|---|---|
| 5,150,193 | 9/1992 | Yasuhara et al. | 257/787 |
| 5,338,973 | 8/1994 | Yoshigai | 257/668 |
| 5,545,923 | 8/1996 | Barber | 257/691 |
| 5,641,987 | 6/1997 | Lee | 257/667 |
| 5,708,294 | 1/1998 | Toriyama | 257/667 |
| 5,712,507 | 1/1998 | Eguchi et al. | 257/666 |
| 5,763,942 | 6/1998 | Suzuki | 257/666 |

FOREIGN PATENT DOCUMENTS 55-53450  4/1980  Japan .................................. 257/667

*Primary Examiner*—Mahshid Saadat
*Assistant Examiner*—Jhihan B. Clark
*Attorney, Agent, or Firm*—Jones Volentine, LLP

[57] ABSTRACT

A semiconductor apparatus includes a semiconductor chip and a die pad on which the semiconductor chip is mounted. The die pad is provided thereon with an opening. The semiconductor chip and the die pad may be shaped to be similar figures of rectangle, and the opening may include a plurality of first slits which are arranged around the corners of the die pad, respectively.

25 Claims, 13 Drawing Sheets

SEMICONDUCTOR APPARATUS AND METHOD FOR FABRICATING THE SAME

CROSS REFERENCE TO RELATED APPLICATION

This application claims the priority of Application No. H09-043156, filed Feb. 27, 1997 in Japan, the subject matter of which is incorporated herein by reference.

TECHNICAL FIELD OF THE INVENTION

The present invention relates to a semiconductor device and a method for fabricating the same, and more particularly to a lead frame used for fabricating a semiconductor device.

BACKGROUND OF THE INVENTION

For fabricating a semiconductor device, such as an IC package, a semiconductor chip is mounted on a metal frame, which is called a lead frame. After mounting of the semiconductor chip on the metal frame, the semiconductor chip is wire-bonded to leads of the lead frame, and is entirely molded with resin. In general, such a lead frame is formed in a desirable shape by removing unnecessary portions with chemical etching technique or mechanical punching technique. Thus formed lead frame includes a die pad on which the semiconductor chip is mounted and support bars which support the die pad in a molding process. The support bars extend outwardly from the corners of the die pad in a straight line, respectively.

When the semiconductor chip is wire-bonded to leads of the lead frame, the position of each lead is automatically recognized on the basis of the position of the support bars. For better wire-bonding, the lead frame is heated to about one hundred and fifty degrees to two hundred and fifty degrees of Celsius' scale. When the lead frame is maintained at such a high temperature, the support bars are deformed with temperature. As a result, an automatic wire-bonding machine can not recognize the leads, because the support bars, which should be the basis of the recognition, are not at the initial positions anymore.

In a resin molding process, according to a conventional technology, it is difficult to provide the same amount of resin both on the upper and lower surfaces of the lead frame. In more detail, more resin is provided on the upper surface of the support bars than the lower surface thereof, because the same thickness of resin is usually intended to be provided on the upper surface of the semiconductor chip and the bottom surface of the die pad. Because of the difference of coefficients of thermal expansion between the resin and the lead frame, and of the difference of amount of resin arranged on the upper and lower surfaces of the lead frame, the semiconductor apparatus may warp when its temperature falls down to the room temperature.

A kind of semiconductor device is fabricated using a lead frame which is depressed at some portions to allow a die pad to be lowered relative to the other portion of the lead frame. In a die-bonding process, the semiconductor chip is mounted on the lowered die pad with die-bonding material, and the entire structure is heated to harden the die-bonding material. In the thermosetting process, the depressed portions of the lead frame are deformed by stress relaxation, so that the level difference at each of the depressed portions changes from its initial value. And therefore, according to the conventional technology, the die pad and/or the semiconductor chip is not well covered with resin in the molding process. As a result, the die pad and/or the semiconductor chip may be exposed to outside of a resin package.

When the semiconductor device is mounted on a substrate, the semiconductor device is heated to the melting temperature of a conductive paste. According to the conventional technology, the die pad is applied with some stress at its corners in the mounting process, so that some cracks may be made in the resin package.

OBJECTS OF THE INVENTION

Accordingly, an object of the invention is to provide a semiconductor device in which a lead frame is prevented from thermal deformation to realize reliable automatic-recognition of leads of the lead frame in a wire-bonding process.

Another object of the invention is to provide a no-warped semiconductor device.

Still another object of the invention is to provide a semiconductor device in which a die pad and a semiconductor chip can be prevented from being exposed to outside a package.

Further object of the invention is to provide a semiconductor device which is prevented from having cracks therein.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a semiconductor device includes a semiconductor chip and a die pad on which the semiconductor chip is mounted. The die pad is provided thereon with an opening. The semiconductor chip and the die pad may be shaped to be similar figures of rectangle, and the opening may include a plurality of first slits which are arranged around the corners of the die pad, respectively. The semiconductor chip may be called a semiconductor pellet or a semiconductor device.

According to a second aspect of the invention, a lead frame includes a die pad on which a semiconductor chip is mounted. The die pad is provided with an opening thereon. The semiconductor chip and the die pad may be shaped to be similar figures of rectangle, and the opening may include a plurality of first slits which are arranged around the corners of the die pad, respectively.

According to a third aspect of the invention, in a combination of a lead frame and a wire-bonding stage, the lead frame includes a die pad on which a semiconductor chip is mounted, the die pad being provided thereon with an opening. The wire-bonding stage includes a projection which fits in the opening of the lead frame in a wire-bonding process.

According to a fourth aspect of the invention, a method for fabricating a semiconductor device includes the following steps: A step for forming a plurality of slits around the peripheral edge of a die pad of a lead frame; a step for mounting a semiconductor chip on the die pad; a step for providing a wire-bonding stage; a step for forming on the wire-bonding stage a plurality of projections to be fit in the slits of the die pad, respectively; a step for placing the lead frame with semiconductor chip on the wire-bonding stage so that the projections of the wire-bonding stage fit in the slits of the die pad; and a step for wire-bonding the semiconductor chip to leads of the lead frame.

In the invention the opening on the lead frame absorbs a thermal deformation thereof in any processes. Especially in a wire-bonding process, the leads to be wire-bonded to the semiconductor chip are prevented from their thermal deformation, and therefore, the leads can be reliably recognized in an automatic wire-bonding process.

When the openings are formed around the peripheral edge of the die pad, an area between the edge and openings is narrowed, so that the narrowed portion can be easily depressed to lower the die pad relative to leads. With the lowered die pad, a short-circuit problem is avoided and a reliable wire-bonding is performed. Because the depressed portion is formed inside the die pad area, the same thickness of resin can be easily arranged on both the upper and lower surfaces of the lead frame. As a result, the semiconductor device is prevented from being warped, which is caused by the difference of volume of resin between the upper and lower surfaces of the lead frame and by the difference of coefficients of thermal expansion between the resin and the lead frame.

In a molding process, the opening absorbs thermal deformation of the lead frame, so that the depressed portion is prevented from being changed in level. The level difference at the depressed portion, which is a distance between the die pad and the other portion of the lead frame, does not change from its initial value. The resin is desirably provided on the semiconductor chip and the lead frame. As a result, the die pad and semiconductor chip are prevented from being exposed to outside of a resin package.

In a process for mounting the finished semiconductor device on a substrate, the opening absorbs a thermal deformation of the lead frame. Therefore, the semiconductor device can be prevented from being warped.

DETAILED DISCLOSURE OF THE INVENTION

Figure 1:
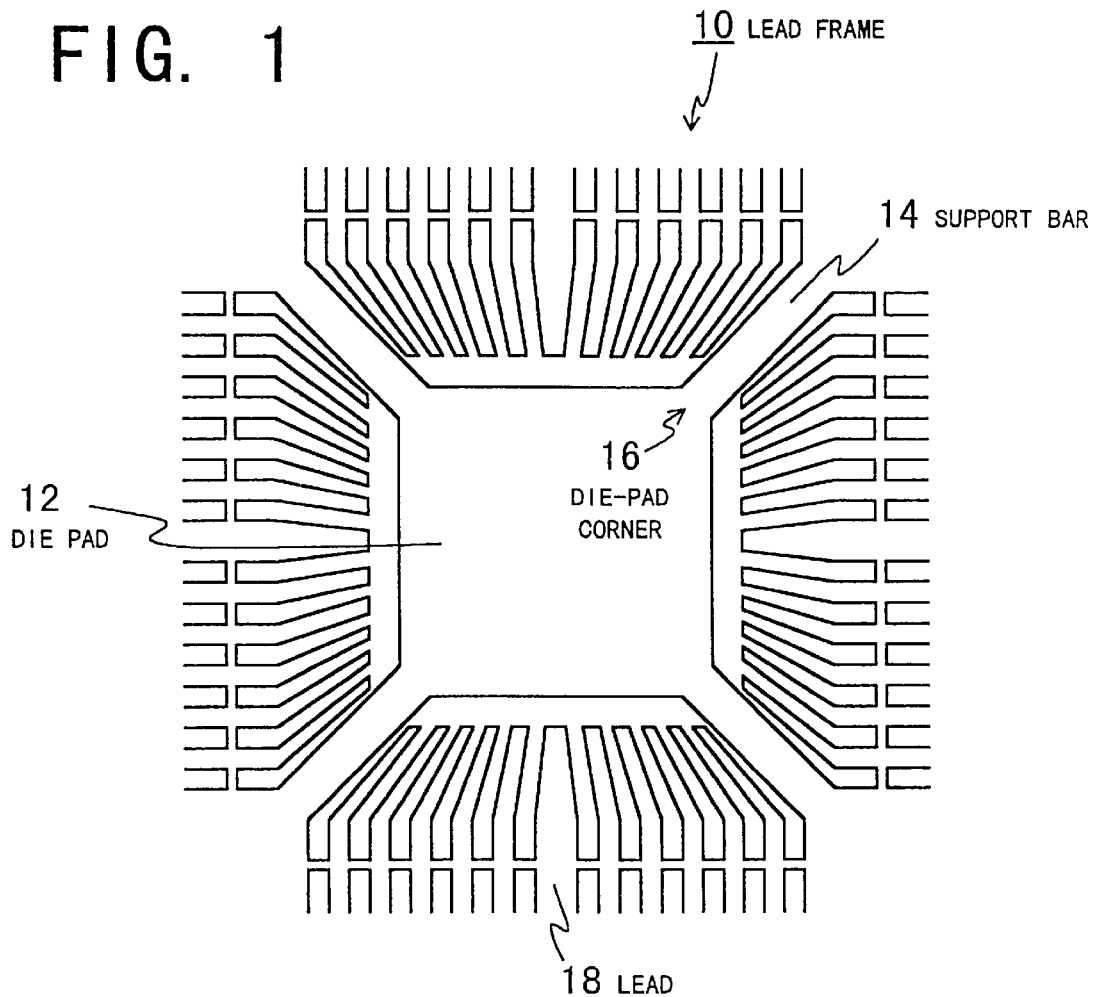
FIG. 1 is a plan view showing a lead frame used for fabricating a conventional semiconductor device.
Figure 2:
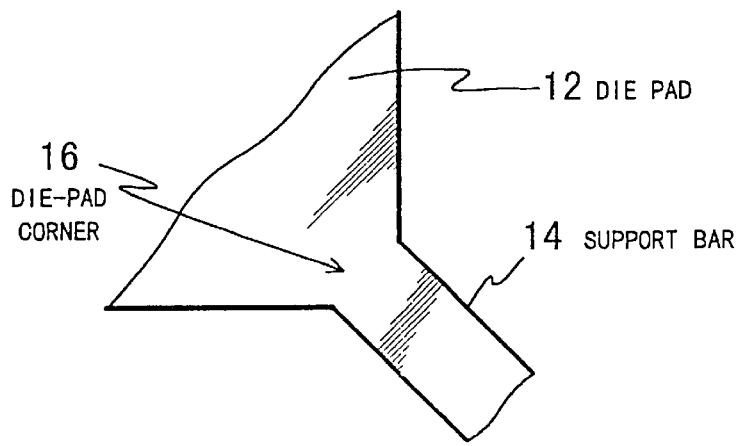
FIG. 2 is an enlarged plan view showing a part of the lead frame shown in FIG. 1.

For better understanding of the invention, background technology is first described. FIG. 1 shows a lead frame 10 used for fabricating a conventional semiconductor device, such as an IC package. FIG. 2 shows a part of the lead frame 10. The lead frame 10 includes a die pad 12, on which a semiconductor chip is mounted, support bars 14 respectively extending from die-pad corners 16 outwardly in a straight line and a plurality of leads 18 surrounding the die pad 12, which are bonded to the semiconductor chip. The die pad 12 is shaped to be a similar figure of rectangle to the semiconductor chip.

In fabrication, a semiconductor chip is mounted on the die pad 12, and a wire-bonding process is carried out. In the wire-bonding process, the die pad 12 is placed on a flat stage and is fastened thereon by vacuuming or the like. When the semiconductor chip is wire-bonded to leads 18 of the lead frame 10, the position of each lead 18 is automatically recognized on the basis of the position of the support bars 14. In this wire-bonding process, the lead frame 10 is heated to about one hundred and fifty degrees to two hundred and fifty degrees of Celsius' scale for better bonding. As the lead frame 10 is maintained at such a high temperature, the support bars 14 are deformed with temperature. As a result, an automatic wire-bonding machine can not recognize the leads 18, because the support bars 14, which should be the basis of the recognition, are not at their initial positions.

In a resin molding process, according to the conventional semiconductor device, it is difficult to arrange the same amount of resin both on the upper and lower surfaces of the lead frame 10. In more detail, more resin is arranged on the upper surface of the support bars 14 than the lower surface thereof, because the same thickness of resin is usually intended to be arranged on the upper surface of the semiconductor chip and the bottom surface of the die pad 12. Because of the difference of coefficients of thermal expansion between the resin and the lead frame 10, and of the difference of amount of resin arranged on the upper and lower surfaces of the lead frame 10, the semiconductor device may warp when its temperature falls down to the room temperature.

A kind of semiconductor device is fabricated using a lead frame which is depressed at some portions to allow the die pad 12 to be lowered relative to the leads 18. In a die-bonding process, the semiconductor chip is mounted on the lowered die pad with die-bonding material, and the entire structure is heated to harden the die-bonding material. In the thermosetting process, the depressed portion of the lead frame 10 is deformed by stress relaxation, so that the level difference at the depressed portion changes from its initial value. According to the conventional lead frame 10, the die pad 12 and/or the semiconductor chip is not well covered with resin in the molding process, because of the level difference at the depressed portion is changed from its initial value. As a result the die pad 12 and/or the semiconductor chip may be exposed to outside of a resin package.

When the semiconductor device is mounted on a substrate, the semiconductor device is heated to the melting temperature of a conductive paste. According to the conventional technology, the die pad 12 is applied with some stress at its corners 16 in the mounting process, so that some cracks may be made in the resin package.

Preferred embodiments of the invention are now described in conjunction with the appended drawings.

Figure 3:
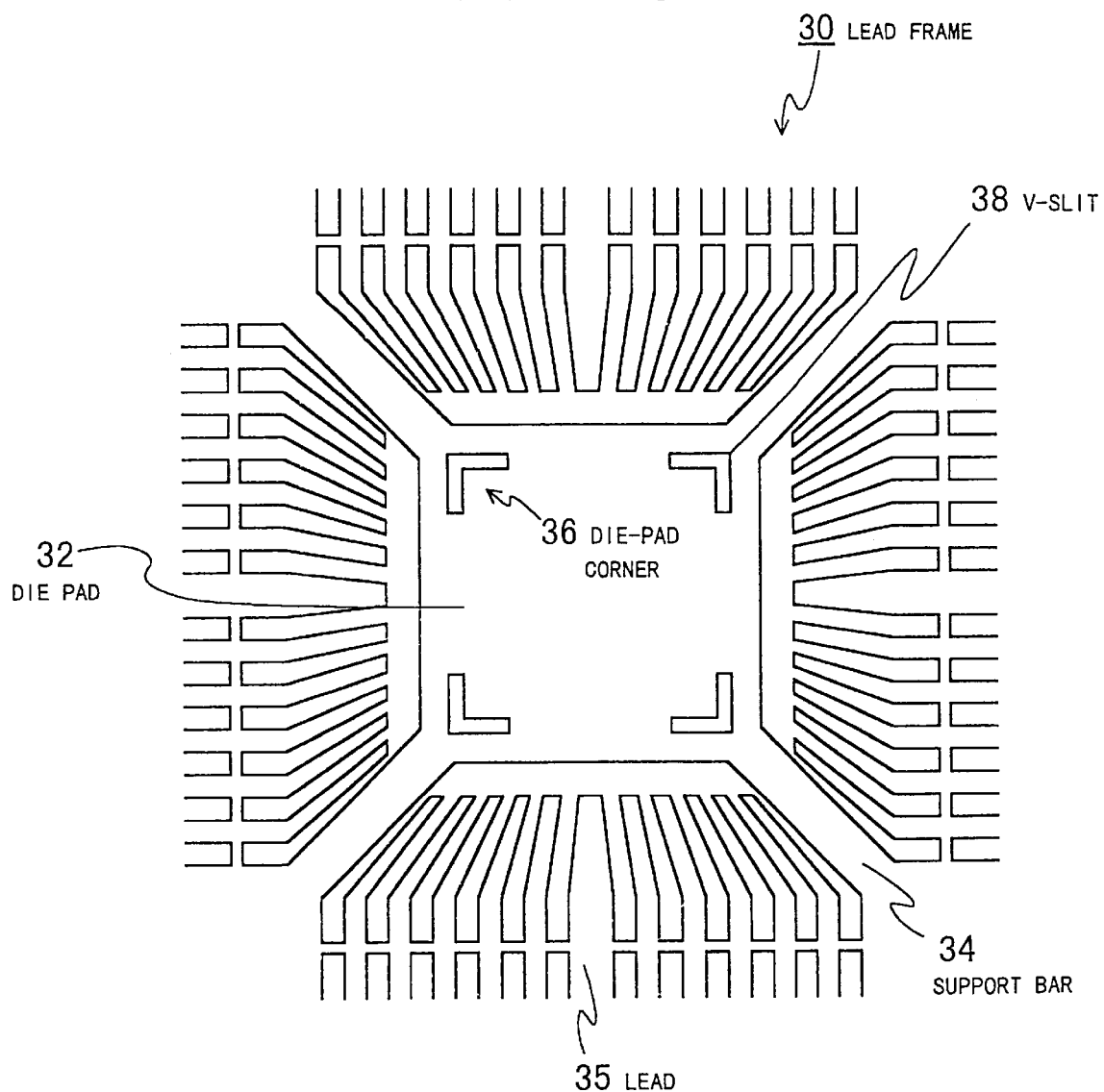
FIG. 3 is a plan view showing a lead frame used for fabricating a semiconductor device according to a first preferred embodiment of the invention.
Figure 4:
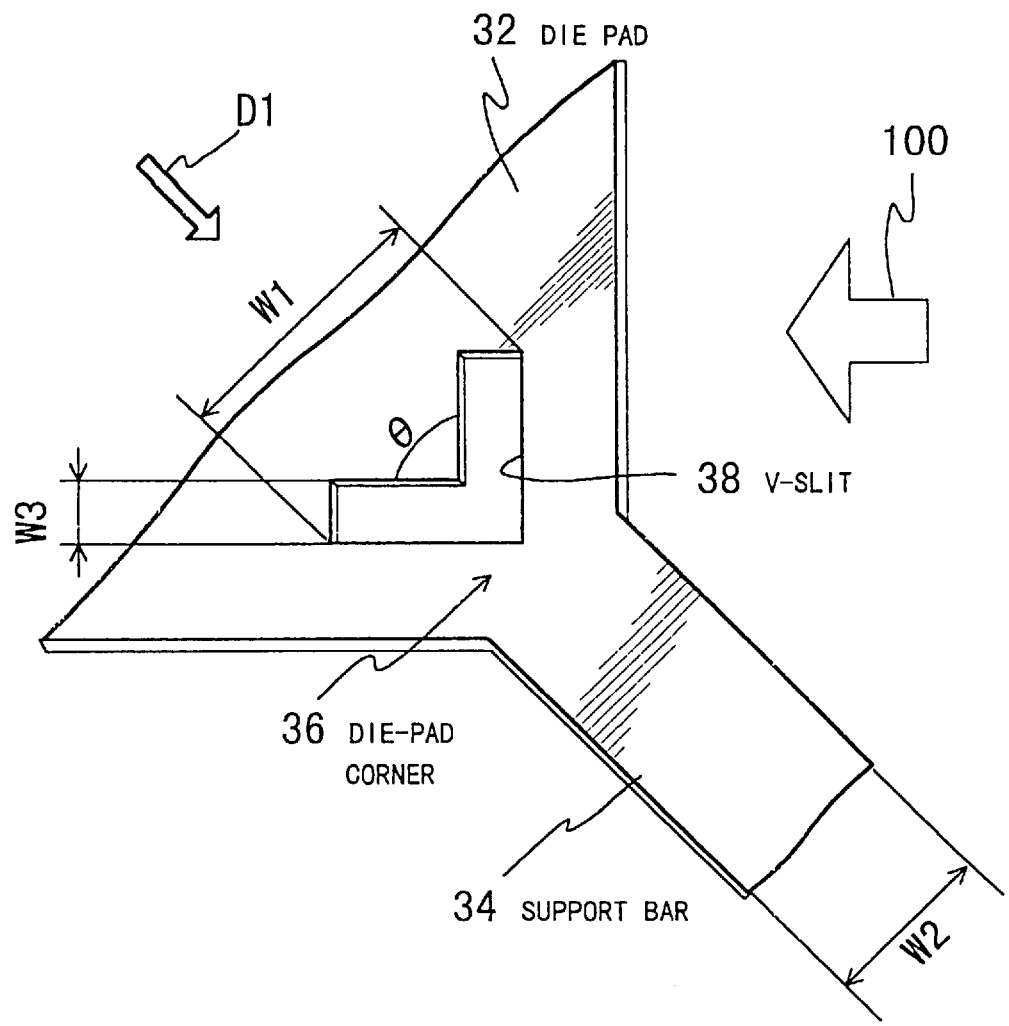
FIG. 4 is an enlarged plan view showing a part of the lead frame shown in FIG. 3.
Figure 5:
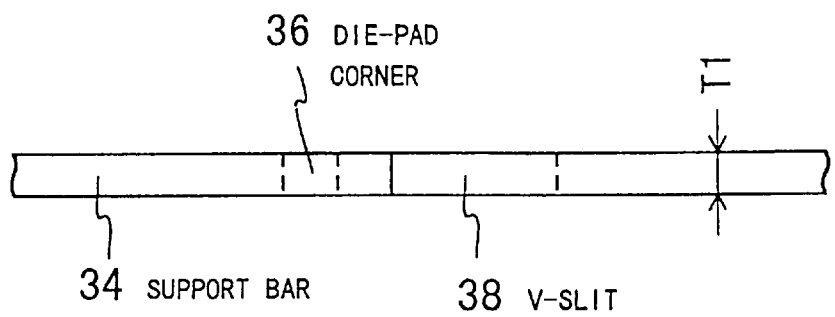
FIG. 5 is a side view showing the part of the lead frame shown in FIG. 4, which is looked from a direction of an arrow 100.

FIG. 3 shows a lead frame 30 used for fabricating a semiconductor apparatus according to a first preferred embodiment of the invention. FIGS. 4 and 5 show a part of the lead frame 30, respectively. The lead frame 30 includes a die pad 32, on which a semiconductor chip 22 is mounted, support bars 34 respectively extending from die-pad corners 36 outwardly in a straight line and a plurality of leads 35 surrounding the die pad 32, which are bonded to the semiconductor chip 22. The die pad 32 is shaped to be a similar figure of rectangle to the semiconductor chip 22, shown in FIG. 6.

The die pad 32 is provided at the die-pad corners 36 with V shaped openings 38, hereinafter called V-slits. As shown in FIGS. 4 and 5, each of the V-slits 38 is designed to have a width W1 which is wider than a width W2 of the support bar 34. Each V-slit 38 is also designed to have a center angle θ of eighty degrees to one hundred and twenty degrees, and have a groove width W3 which is larger than the thickness T1 of the lead frame 30.

Figure 6:
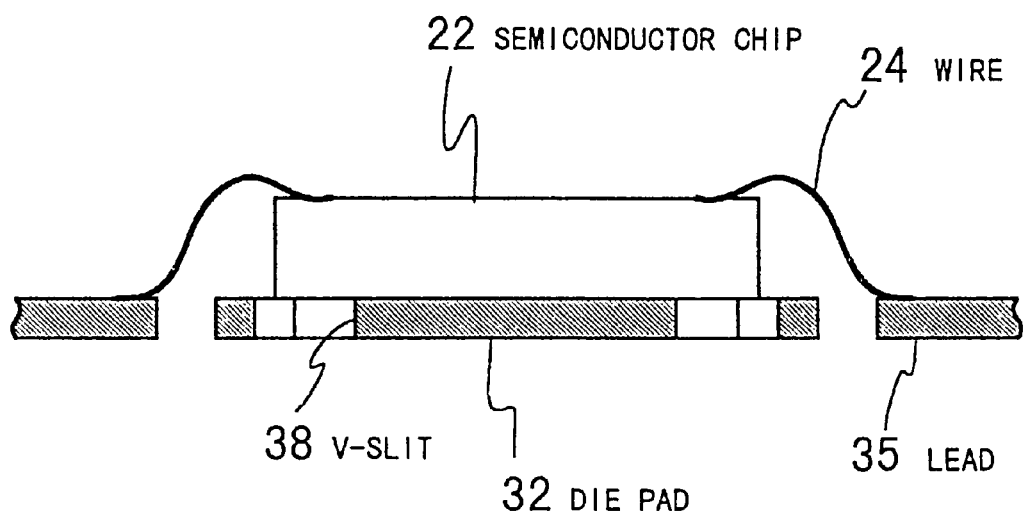
FIG. 6 is a cross sectional view showing a semiconductor chip and the lead frame shown in FIGS. 3 to 5 in a wire-bonding process.

In fabrication, the semiconductor chip 22 is mounted on the die pad 32, and wires 24 are bonded to the semiconductor chip 22 and the leads 35 in a wire-bonding process, as shown in FIG. 6. Before the wire-bonding process, position data of each of the V-slits 38 are stored in a memory of an automatic wire-bonding machine, in advance, to perform automatic recognition of the leads 35. The position data represent where the V-slit is located in the lead frame 30. The wire-bonding machine automatically recognizes the position of each lead 35 on the basis of the position of each V-slit 38, which does not expand thermally.

In the wire-bonding process, the lead frame 30 is heated to about one hundred and fifty degrees to two hundred and fifty degrees of Celsius' scale for better bonding. As the lead frame 30 is maintained at such a high temperature, the lead frame 30 expands thermally according to its coefficient of thermal expansion. The lead frame 30 expands in a wide range especially in a direction D1, in which the support bars 34 are extending. The expansion of the lead frame 30 is absorbed by the V-slits 38 at the die-pad corners 36.

According to the first preferred embodiment, the automatic wire-bonding machine can precisely recognize the leads 35, because the thermal expansion of the lead frame 30 is absorbed by the V-slits 38. The V-slits 38 are used as the basis of the automatic recognition of leads 35. In a wire-bonding process, narrow leads having a width between 0.06 mm and 0.08 mm can be precisely recognized, while leads having a width between 0.08 mm and 0.10 mm have been used conventionally.

Figure 7:
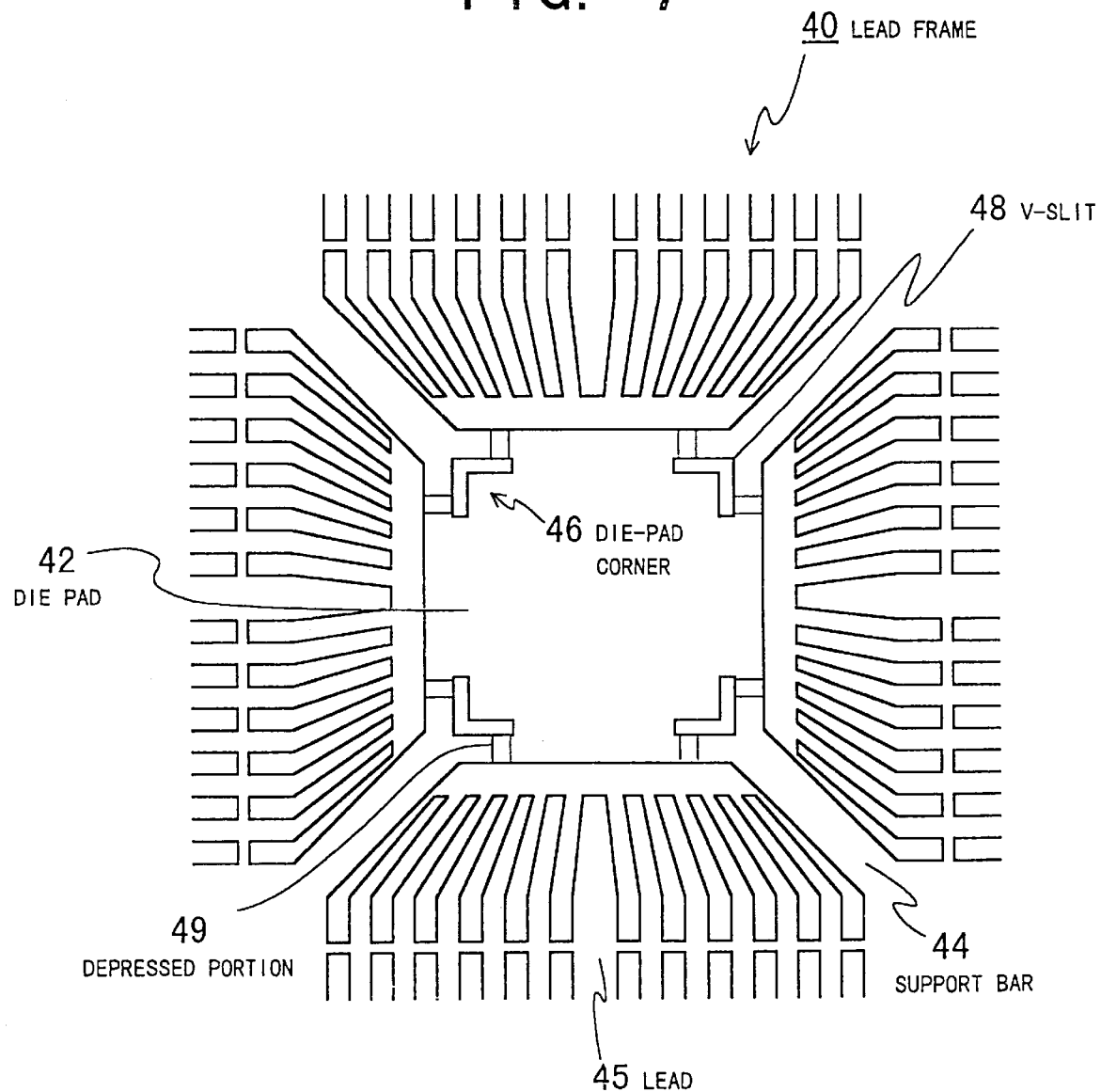
FIG. 7 is a plan view showing a lead frame used for fabricating a semiconductor device according to a second preferred embodiment of the invention.
Figure 8:
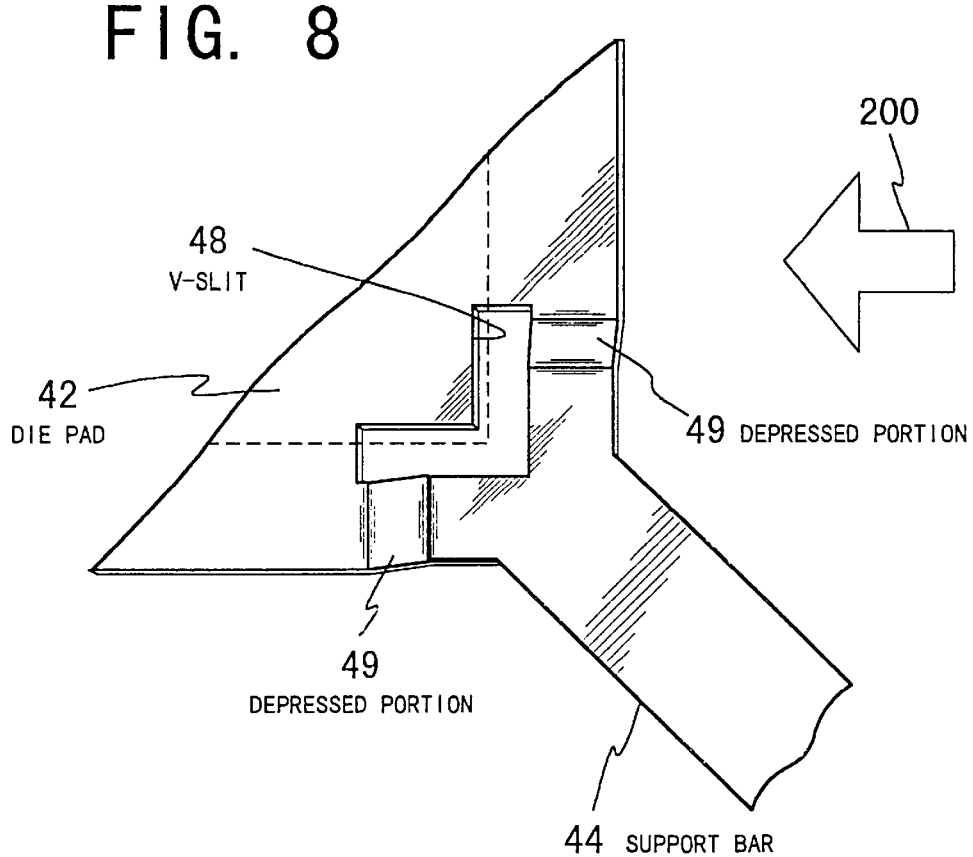
FIG. 8 is an enlarged plan view showing a part of the lead frame shown in FIG. 7.
Figure 9:
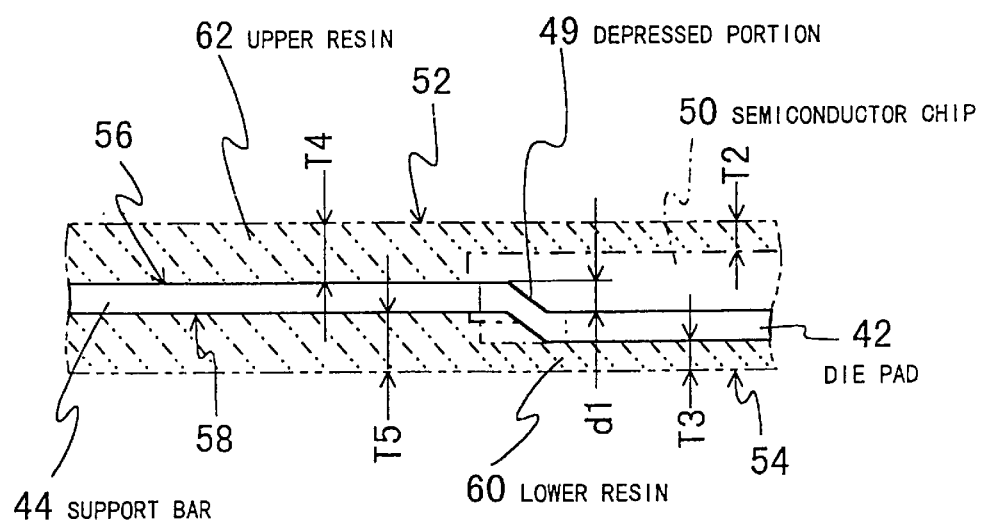
FIG. 9 is a side view showing the part of the lead frame shown in FIG. 8, which is looked from a direction of an arrow 200.

FIG. 7 shows a lead frame 40 used for fabricating a semiconductor device according to a second preferred embodiment of the invention. FIGS. 8 and 9 show a part of the lead frame 40, respectively. The lead frame 40 includes a die pad 42, on which a semiconductor chip 50 is mounted, support bars 44 respectively extending from die-pad corners 46 outwardly in a straight line and a plurality of leads 45 surrounding the die pad 42, which are bonded to the semiconductor chip 50. The die pad 42 is shaped to be a similar figure of rectangle to the semiconductor chip 50, shown in FIGS. 9 to 11.

Referring now to FIGS. 8 and 9, the die pad 42 is provided at the die-pad corners 46 with V shaped openings 48, hereinafter called V-slits. The die pad 42 is also provided with depressed portions 49 at the both sides of each V-slit 48. In more detail, the die pad 42 is depressed at narrower areas between the peripheral edge thereof and the V-slits 48 in order to lower the die pad 42 relative to the other portion of the lead frame 40. In consideration of a molding process, each of the depressed portions 49 is designed to have a suitable level difference (d1) so that a thickness T2 of resin on the upper surface of the semiconductor chip 50 is the same as a thickness T3 of resin on the lower surface of the die pad 42. Each of the V-slits 48 is designed to have a width, a center angle and a groove width in the same manner as the V-slits 38 shown in FIGS. 3 to 6.

Figure 10:
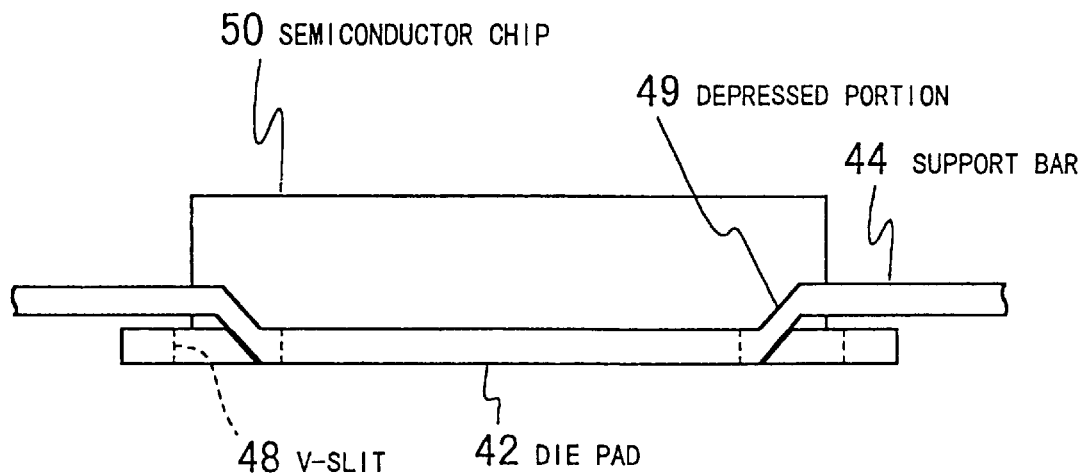
FIG. 10 is a side view showing the lead frame shown in FIG. 8 with a semiconductor chip.

In fabrication, first, the semiconductor chip 50 is mounted on the lowered die pad 42 with die-bonding material, as shown in FIG. 10. Then, the entire structure is heated to harden the die-bonding material. In the thermosetting process, the thermal expansion of the support bars 44 is absorbed by the V-slits 48 before the expansion reaches the depressed portions 49. Therefore, the level difference (d1) of the depressed portions 49 is not changed from its initial value. In other words, no stress relaxation is made at the depressed portions 49 when the temperature of the structure falls down to the room temperature, so that the level difference (d1) of the depressed portions 49 does not change even in molding process at high temperatures. As a result, the same volume of resin can be provided on both surfaces of the lead frame 40 in a cavity for molding.

Figure 11:
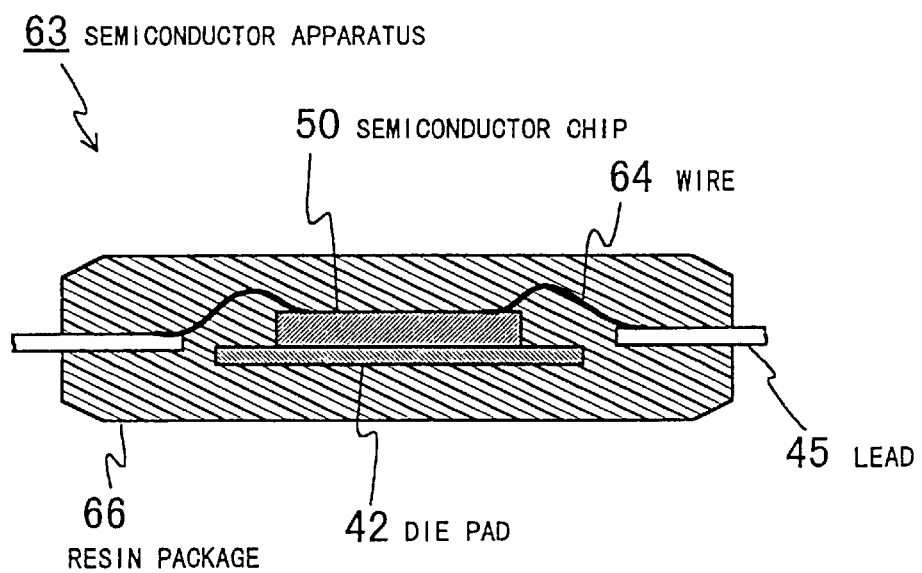
FIG. 11 is a cross sectional view illustrating the semiconductor device of the second preferred embodiment.

In a wire-bonding process, wires 64 are bonded to the semiconductor chip 50 and the lead 45 of the lead frame 40, as shown in FIG. 11. After the wire-bonding process, a resin molding process is carried out to provide a resin package 66 to complete a semiconductor apparatus 63, shown in FIG. 11. In a resin molding process, the resin is injected into a cavity at a high temperature in a range between one hundred and fifty degrees and two hundred and twenty degrees of Celsius' scale, then the resin is cooled down to the room temperature of twenty-five degrees of Celsius' scale. The difference of the temperatures is about one hundred and twenty-five to one hundred and ninety-five degrees of Celsius' scale. Because of the change of temperature, the resin and the lead frame 40 shrink thermally.

As mentioned above, the level difference (d1) of the depressed portions 49 do not change, therefore the thickness T2 of the resin on the upper surface of the semiconductor chip 50 and the thickness T3 of the resin on the lower surface of the die pad 42 keep equal. Further, the same thickness of resin is provided on the upper and lower surfaces of the support bar 44. In other words, a distance T4 between the upper surface 56 of the support bar 44 and the upper surface 52 of the resin and a distance T5 between the lower surface of the support bar 44 and the lower surface 54 of the resin are the same. Thus, the volume of an upper resin 62 provided on the upper surfaces of the semiconductor chip 50 and the support bar 44 and the volume of a lower resin 60 provided on the lower surfaces of the semiconductor chip 50 and the support bar 44 becomes equal. As a result, no difference in shrink rate is made between the upper resin 62 and the lower resin 60.

As mentioned before, according to the second preferred embodiment of the invention, the V-slits 48 are provided at the die-pad corner 46 of the die pad 42 and the depressed portions 49 are provided at both sides of each of the V-slits 48; and therefore, the following advantages can be obtained in addition to the advantages of the first preferred embodiment: (1) The same volume of resin is provided on both surfaces of each of the support bars 44, so that the fabricated semiconductor device 63 is prevented from being warped, basically caused by the difference of shrink rates between the resin provide on the upper surfaces of the support bars 44 and the lower surfaces thereon. (2) Each of the depressed portions 49 maintains its initial level difference d1, the semiconductor chip 50 and the die pad 42 are prevented from being exposed to outside of the resin package.

Figure 12:
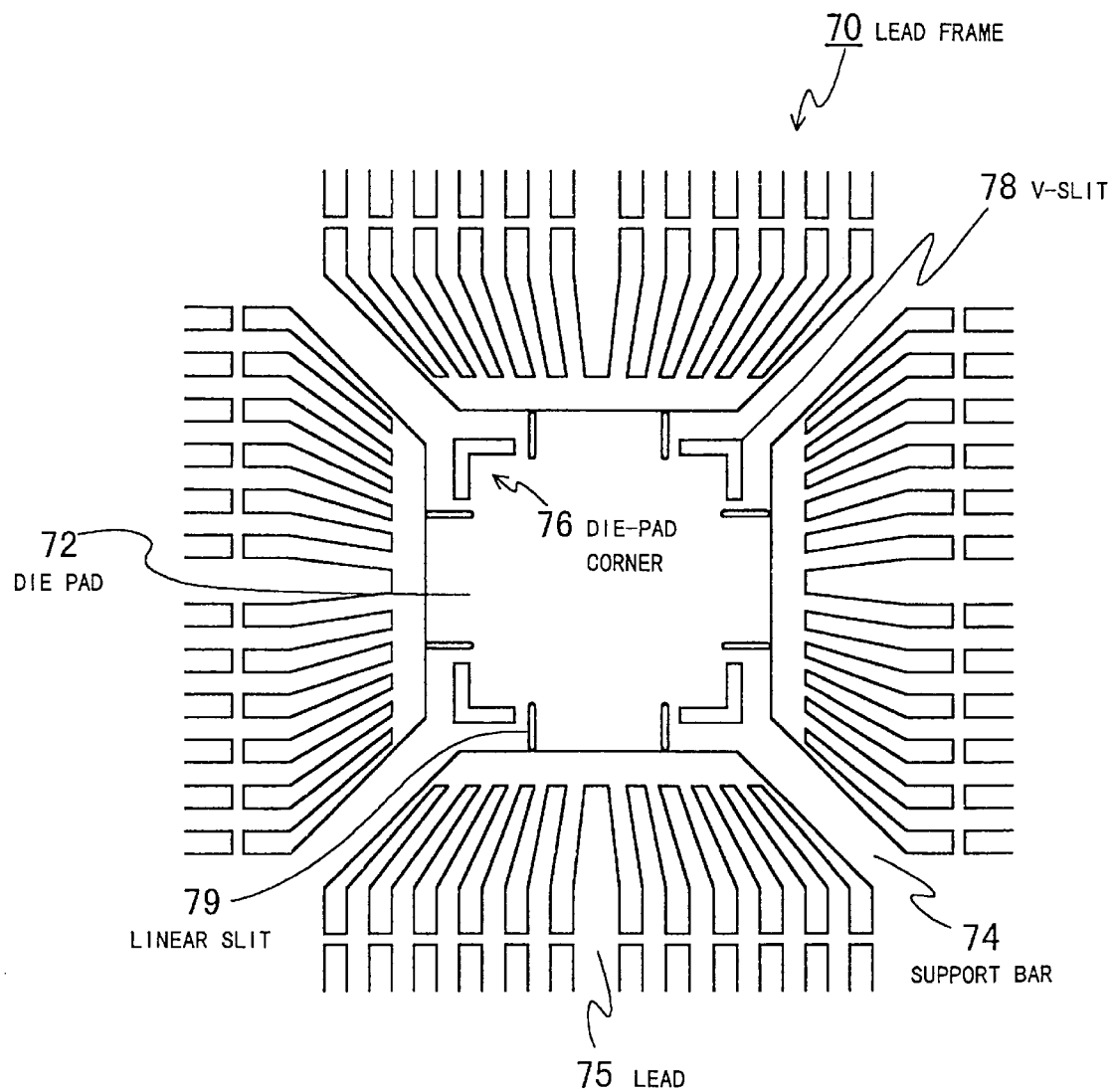
FIG. 12 is a plan view showing a lead frame used for fabricating a semiconductor device according to a third preferred embodiment of the invention.
Figure 13:
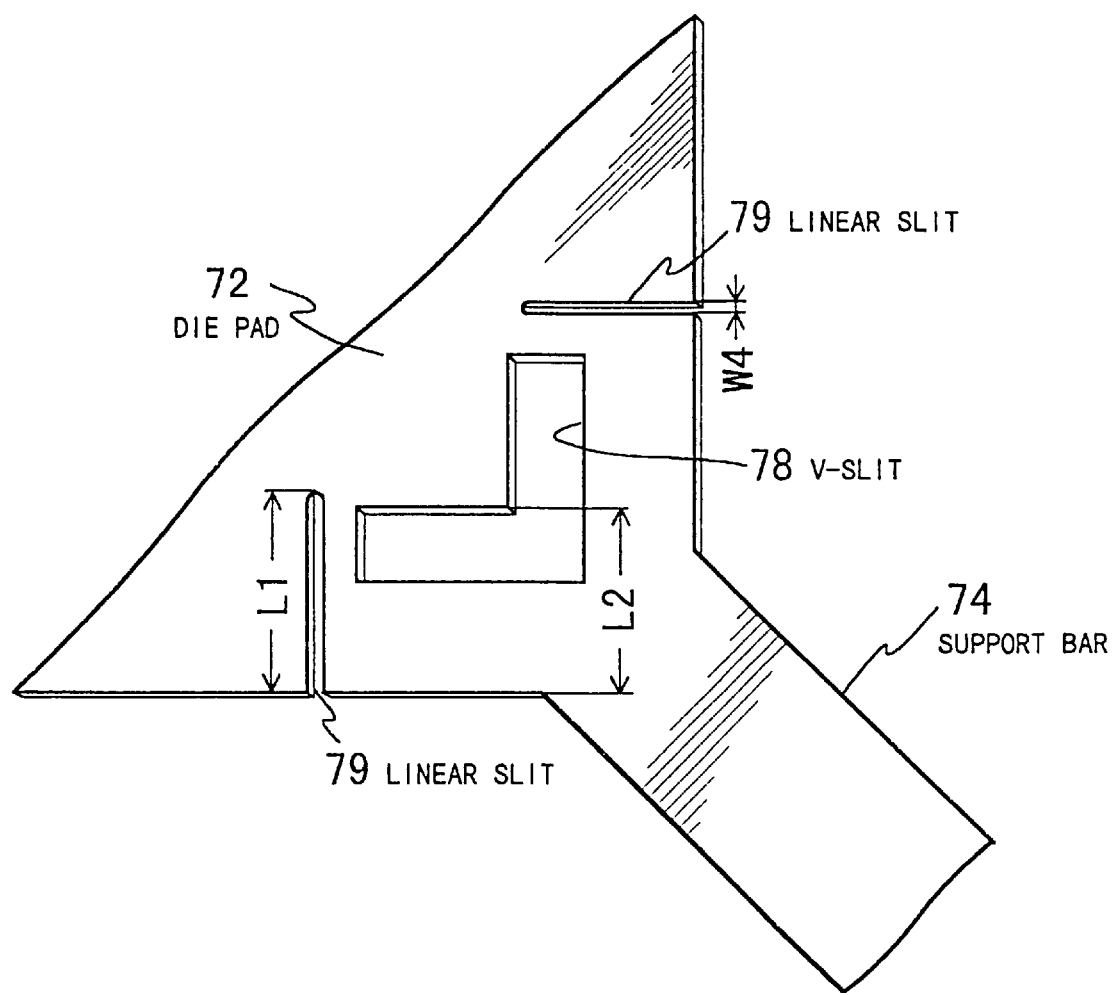
FIG. 13 is an enlarged plan view showing a part of the lead frame shown in FIG. 12.

FIG. 12 shows a lead frame 70 used for fabricating a semiconductor device according to a third preferred embodiment of the invention, and FIG. 13 shows a part of the lead frame 70. The lead frame 70 includes a die pad 72, on which a semiconductor chip 69 is mounted, support bars 74 respectively extending from die-pad corners 76 outwardly in a straight line and a plurality of leads 75 surrounding the die pad 72, which are bonded to the semiconductor chip 69 shown in FIG. 14. The die pad 72 is shaped to be a similar figure of rectangle to the semiconductor chip 69, shown in FIG. 14.

The die pad 72 is provided at both sides of each of the V-slits 78 with linear slits 79. As shown in FIG. 13, each of the linear slits 79 is shaped to have a length L1, which is larger than a distance L2 between the edge of the die pad 72 and the V-slit 78. Each of the linear slits 79 is also shaped to have a width W4 which is larger than the thickness of the lead frame 70.

Figure 14:
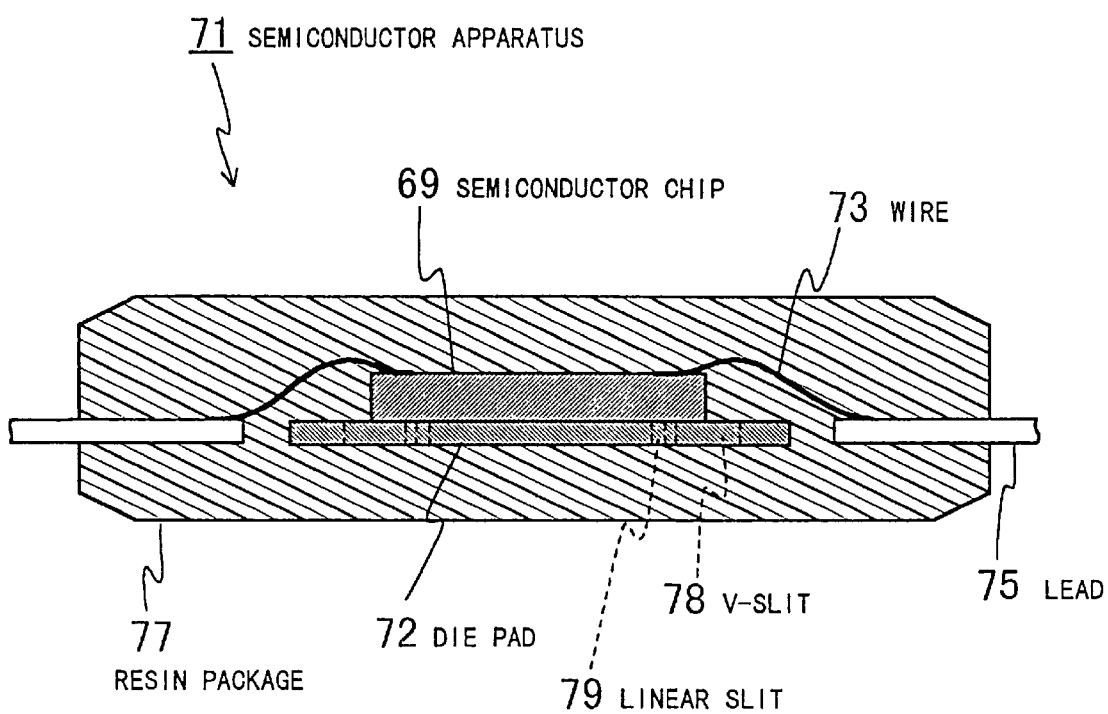
FIG. 14 is a cross sectional view illustrating the semiconductor device of the third preferred embodiment.

In fabrication, the semiconductor chip 69 is mounted on the die pad 72 in a die-bonding process, then wires 73 are bonded to the semiconductor chip 69 and the leads 75 of the lead frame 70 in a wire-bonding process, as shown in FIG. 14. Next, a resin molding process is carried out to make a resin package 77 to complete a semiconductor apparatus 71. Then, the semiconductor device 71 is mounted on a substrate. This mounting process is carried out at a high temperature in a range between one hundred and eighty degrees and two hundred and fifty degrees of Celsius' scale, so that the die pad 72 and molding resin 77 expand thermally. Because of the difference of coefficients of thermal expansion between the die pad 72 and molding resin, stress is applied to both surfaces of the die pad 72. In this embodiment, the stress is absorbed by the V-slits 78 and the linear slits 79.

According to the third preferred embodiment of the invention, the die pad 72 of the lead frame 70 is provided at the die-pad corners 76 with the V-slits 78, and at both sides of each V-slit 78 with the linear slits 79, so that the V-slits 78 and the linear slits 79 absorb thermal stress, which is made when the semiconductor device 71 is mounted on the substrate. As a result, there is an advantage in that the resin package 77 of the semiconductor device 71 is prevented from having cracks therein, in addition to the advantages of the first preferred embodiment.

Figure 15:
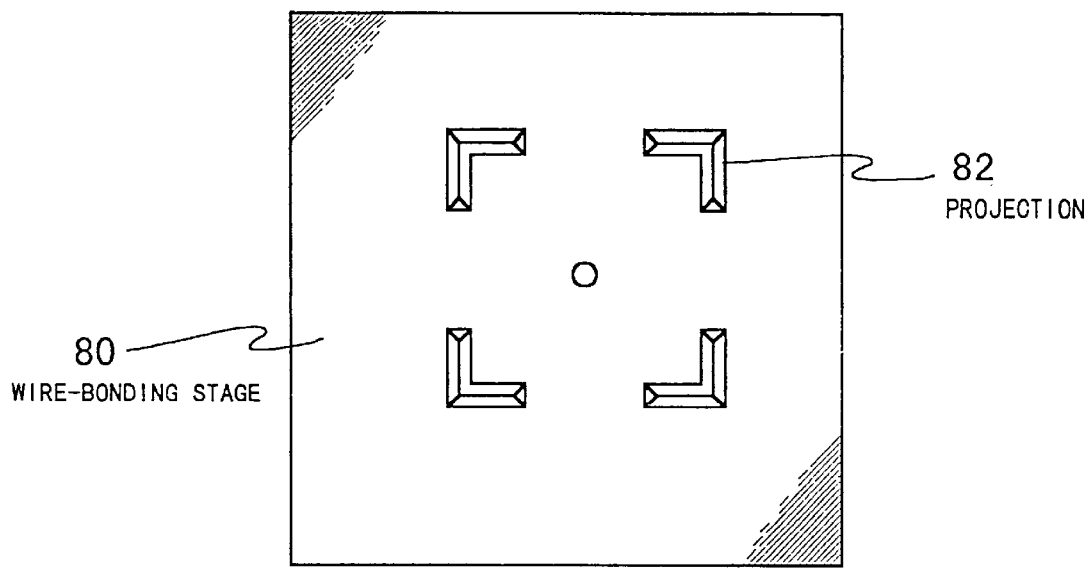
FIG. 15 is a plan view showing a wire-bonding stage used in a wire bonding process according to a fourth preferred embodiment of the invention.
Figure 16:
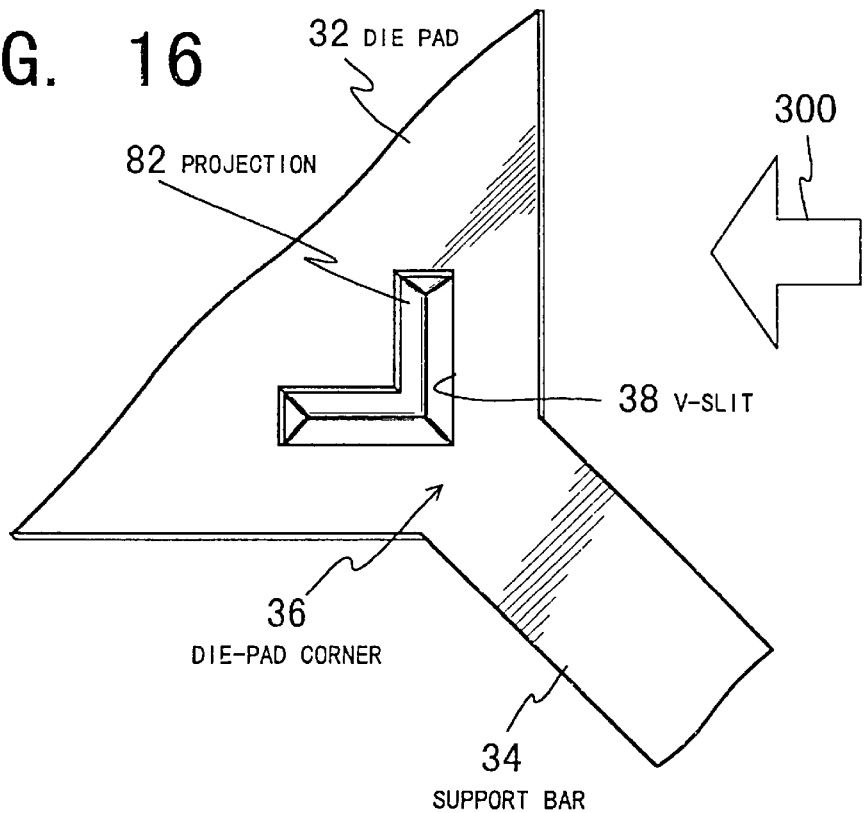
FIG. 16 is an enlarged plan view showing a part of the wire-bonding stage shown in FIG. 15 with the lead frame.
Figure 17:
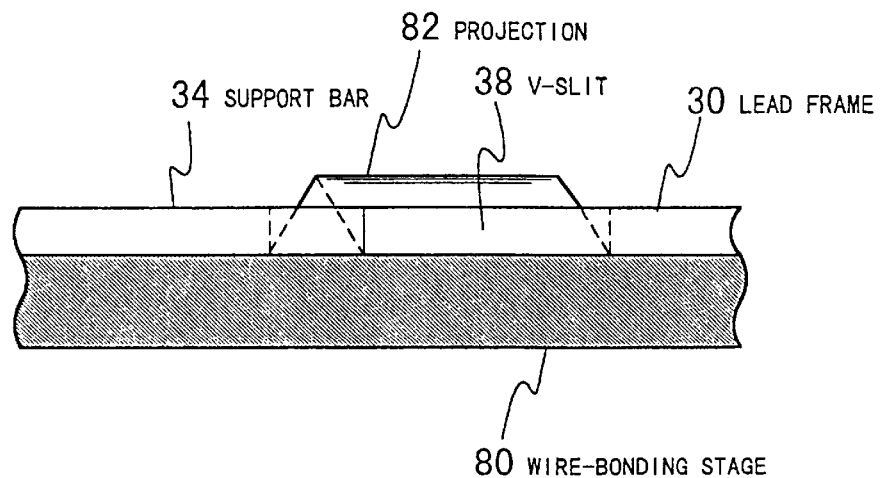
FIG. 17 is a side view showing the part of the wire-bonding stage with the lead frame, which is looked from a direction of an arrow 300.

FIG. 15 shows a wire-bonding stage 80 according to a fourth preferred embodiment of the invention, which is used with the lead frame 30, shown in FIG. 3. FIGS. 16 and 17 show a part of the wire-bonding stage 80 in practical use, respectively. The wire-bonding stage 80 is provided on the upper surface with four projections 82, which are arranged corresponding to the V-slits 38 of the lead frame 30, respectively. Each of the projection 82 is shaped to fit in the corresponding V-slit 38.

Figure 18:
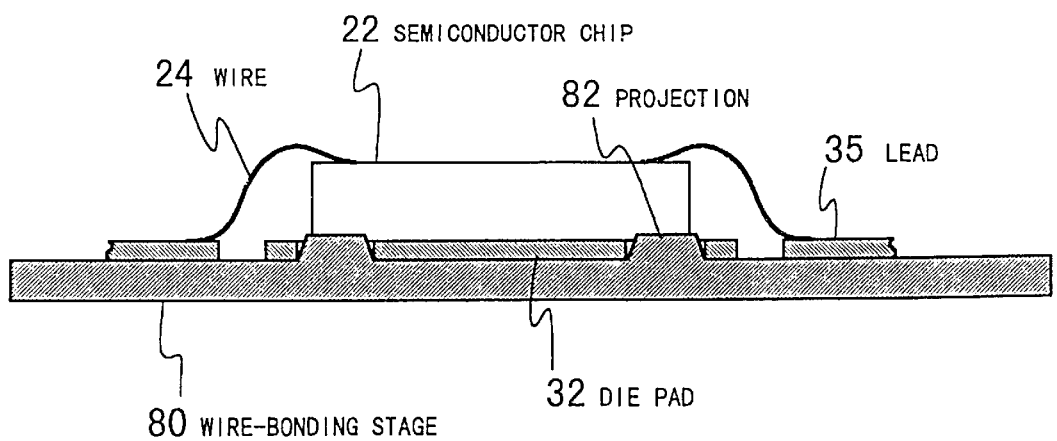
FIG. 18 is a cross sectional view showing a semiconductor chip and the lead frame shown in FIGS. 3 to 5 in a wire-bonding process.

In the wire-bonding process, the lead frame 30 is placed on the wire-bonding stage 80 so that the V-slits 38 are caught by the projections 82 to fix the die pad 32 of the lead frame 30 on the stage 80. While fixing the die pad 32 in that way, wire-bonding process is carried out, as shown in FIG. 18. When the wire-bonding is finished with the die pad 32, the next die pad is set on the wire-bonding stage in the same manner. Using the wire-bonding stage 80, the lead frame 30 is prevented from being deformed. Further, the lead frame 30 is fixed by the projections 82 with strong mechanical power, so that the wire-bonding process can be performed with weak mechanical power.

Figure 19:
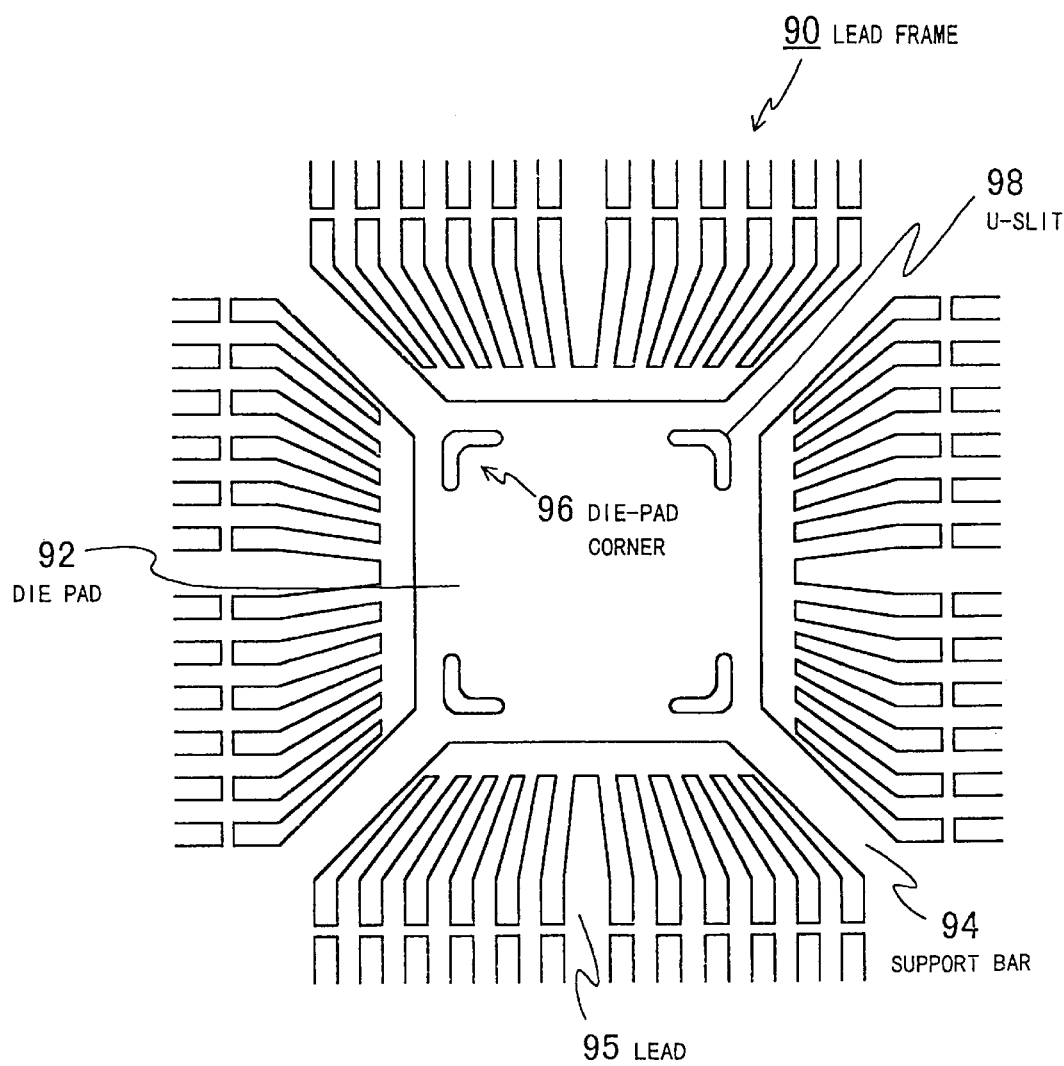
FIG. 19 is a plan view showing a lead frame used for fabricating a semiconductor device according to a fifth preferred embodiment of the invention.

FIG. 19 shows a lead frame 90 used for fabricating a semiconductor device according to a fifth preferred embodiment of the invention. The lead frame 90 includes a die pad 92, on which a predetermined semiconductor chip is mounted, support bars 94 respectively extending from die-pad corners 96 outwardly in a straight line and a plurality of leads 95 surrounding the die pad 92, which are bonded to the semiconductor chip. The die pad 92 is shaped to be a similar figure of rectangle to the semiconductor chip.

The die pad 92 is provided at the die-pad corner 96 with U shaped openings 98, hereinafter called U-slits. Each of the U-slits 98 is designed as almost the same as the V-slit 38, shown in FIGS. 3 to 6, except that the corners of each slits 98 are rounded. According to the fifth preferred embodiment, the same advantages as the first preferred embodiment shown in FIGS. 3 to 6 can be obtained.

Although the invention has been described with respect to the specific embodiments for complete and clear disclosure, the appended claims are not be thus limited but are to be construed as embodying all modification and alternative constructions that may occur to one skilled in the art which fairly fall within the basic teaching herein set forth. For instance, the invention is applicable to a ceramic package type of semiconductor device as long as the apparatus employs a lead frame structure. The design of the V-slits are not limited by the embodiments, and other design is applicable. Any of the embodiments does not limit fabrication processes of a semiconductor device, how to form the slits, the number of slits and the arrangement around the package.

What is claimed is:

1. A semiconductor device, comprising:

a die pad;

a semiconductor chip which is mounted on the die pad; and supporting members which support said die pad, wherein said die pad is provided with openings at portions supported by the supporting members and wherein said supporting members respectively support corners of said die pad and said openings in said die pad include an opening at each corner of said die pad.

2. The semiconductor apparatus, according to claim 1, wherein the semiconductor chip and the die pad are shaped to be similar rectangular figures.

3. The semiconductor device, according to claim 1, wherein each opening of the die pad is formed in a V-shape.

4. The semiconductor device, according to claim 1, wherein each opening of the die pad is formed in a U-shape.

5. The semiconductor device, according to claim 1, wherein each opening of the die pad is provided at both its sides with side slits, each of which is formed in a linear shape.

6. The semiconductor device, according to claim 1, wherein, the die pad is depressed around the openings to provide a lowered inside area on which the semiconductor chip is to be mounted.

7. A semiconductor device, comprising:

a die pad;

a semiconductor chip which is mounted on the die pad; and supporting members which support said die pad, wherein said die pad is provided with openings at portions supported by the supporting members and wherein said die pad has four sides and four corners, each opening of the die pad is arranged at each corner thereof, and each opening of the die pad comprises first and second slits, which extend along the different sides of the die pad to form a predetermined angle between them.

8. The semiconductor device according to claim 7, wherein said predetermined angle is between eighty degrees and one hundred and twenty degrees.

9. A lead frame used for fabricating a semiconductor apparatus, comprising:

a die pad on which a semiconductor chip is to be mounted;

supporting members which support said die pad, wherein said die pad is provided with openings at portions supported by the supporting members and wherein said supporting members respectively support corners of said die pad and said openings in said die pad include an opening at each corner of said die pad.

10. The lead frame according to claim 9, wherein said die pad is shaped similarly to the semiconductor chip.

11. The lead frame according to claim 9, wherein each opening of the die pad is formed in a V-shape.

12. The lead frame, according to claim 9, wherein each opening of the die pad is formed in a U-shape.

13. The lead frame according to claim 9, wherein each opening of the die pad is provided at both its sides with side slits, each of which is formed in a linear shape.

14. The lead frame according to claim 9, wherein the die pad is depressed around the openings to provide a lowered inside area on which the semiconductor chip is to be mounted.

15. A lead frame used for fabricating a semiconductor device, comprising:

a die pad on which a semiconductor chip is to be mounted;

supporting members which support said die pad, wherein said die pad is provided with openings at portions supported by the supporting members and wherein said die pad has four sides and four corners, each opening of the die pad is arranged at each corner thereof, and each opening of the die pad comprises first and second slits, which extend along the different sides of the die pad to form a predetermined angle between them.

16. The lead frame according to claim 15, wherein said predetermined angle is between eighty degrees and one hundred and twenty degrees.

17. A combination of a lead frame and wire-bonding stage, on which the lead frame is placed when wire-bonding process is carried out, wherein the lead frame comprises:

a die pad on which a semiconductor chip is to be mounted; and supporting members which support said die pad, wherein said die pad is provided with openings at portions supported by the supporting members, and wherein the wire-bonding stage comprises projections which fit in the openings of the lead frame and wherein said supporting members respectively support corners of said die pad and said openings in said die pad include an opening at each corner of said die pad.

18. The combination according to claim 17, wherein the die pad is shaped similarly to the semiconductor chip.

19. The combination, according to claim 17, wherein each opening of the die pad is formed in a V-shape.

20. The combination, according to claim 17, wherein each opening of the die pad is formed in a U-shape.

21. The combination according to claim 17, wherein each opening of the die pad is provided at both its sides with side slits, each of which is formed in a linear shape.

22. The combination according to claim 17, wherein the die pad is depressed around the openings to provide a lowered inside area on which the semiconductor chip is to be mounted.

23. A combination of a lead frame and wire-bonding stage, on which the lead frame is placed when wire-bonding process is carried out, wherein the lead frame comprises:

a die pad on which a semiconductor chip is to be mounted; and supporting members which support said die pad, wherein said die pad is provided with openings at portions supported by the supporting members, and wherein the wire-bonding stare comprises projections which fit in the openings of the lead frame and wherein said die pad has four sides and four corners, each opening of the die pad is arranged at each corner thereof, and each opening of the die pad comprises first and second slits, which extend along the different sides of the die pad to form a predetermined angle between them.

24. A combination, according to claim 23, wherein said predetermined angle is between eighty degrees and one hundred and twenty degrees.

25. A combination of a lead frame and wire-bonding stage, on which the lead frame is placed when wire-bonding process is carried out, wherein the lead frame comprises:

a die pad on which a semiconductor chip is to be mounted; and supporting members which support said die pad, wherein said die pad is provided with openings at portions supported by the supporting members, and wherein the wire-bonding stage comprises projections which fit in the openings of the lead frame and wherein each opening of the die pad is provided at both its sides with side slits, each of which is formed in a linear shape.

* * * * *